United States Patent
Park et al.

(10) Patent No.: US 11,972,977 B2
(45) Date of Patent: Apr. 30, 2024

(54) FABRICATION OF RIGID CLOSE-PITCH INTERCONNECTS

(71) Applicant: INTERNATIONAL BUSINESS MACHINES CORPORATION, Armonk, NY (US)

(72) Inventors: Chanro Park, Clifton Park, NY (US); Kenneth Chun Kuen Cheng, Shatin (HK); Koichi Motoyama, Clifton Park, NY (US); Kisik Choi, Watervliet, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 132 days.

(21) Appl. No.: 17/469,116

(22) Filed: Sep. 8, 2021

(65) Prior Publication Data

US 2023/0072315 A1 Mar. 9, 2023

(51) Int. Cl.
*H01L 21/76* (2006.01)
*H01L 21/768* (2006.01)
*H01L 23/528* (2006.01)

(52) U.S. Cl.
CPC .... *H01L 21/76879* (2013.01); *H01L 23/5283* (2013.01)

(58) Field of Classification Search
CPC ................ H01L 21/76879; H01L 23/5283
USPC ........................................................ 257/595
See application file for complete search history.

(56) References Cited

U.S. PATENT DOCUMENTS

| 5,328,810 | A | 7/1994 | Lowrey et al. |
| 8,247,291 | B2 | 8/2012 | Min et al. |
| 9,058,997 | B2 | 6/2015 | Burkhardt et al. |
| 9,230,809 | B2 | 1/2016 | Chang et al. |
| 9,953,865 | B1 | 4/2018 | Briggs et al. |
| 10,170,306 | B2 | 1/2019 | Lee et al. |
| 11,515,203 | B2* | 11/2022 | Lu ............... H01L 21/76897 |
| 2007/0148968 | A1 | 6/2007 | Kwon et al. |
| 2010/0059825 | A1 | 3/2010 | Yeric et al. |
| 2018/0166330 | A1* | 6/2018 | Chu ............ H01L 21/31144 |

(Continued)

FOREIGN PATENT DOCUMENTS

| CN | 103928394 B | 7/2014 |
| CN | 106200272 B | 12/2016 |

(Continued)

*Primary Examiner* — Phuc T Dang
(74) *Attorney, Agent, or Firm* — Tutunjian & Bitetto, P.C.; Samuel Waldbaum

(57) ABSTRACT

A method of forming interconnects is provided. The method includes forming a plurality of mandrels on an interlayer dielectric (ILD) layer. The method further includes forming sidewall spacers on opposite sides of the each mandrel, wherein a portion of the ILD layer is exposed between adjacent sidewall spacers on adjacent mandrels, and removing the exposed portions of the ILD layer to form a first set of trenches between adjacent sidewall spacers. The method further includes forming a first set of interconnects in the first set of trenches, and removing the mandrels to expose portions of the ILD layer between the sidewall spacers. The method further includes removing the exposed portions of the ILD layer to form a second set of trenches between the sidewall spacers, and forming a second set of interconnects in the second set of trenches.

14 Claims, 9 Drawing Sheets

(56) References Cited

U.S. PATENT DOCUMENTS

2019/0157102 A1* 5/2019 Jian .................... C23C 16/56
2019/0206728 A1 7/2019 Wallace et al.
2020/0006082 A1* 1/2020 Su ................. H01L 21/02178

FOREIGN PATENT DOCUMENTS

EP 1861864 B1 9/2006
KR 20090054235 A 5/2009

* cited by examiner

FABRICATION OF RIGID CLOSE-PITCH INTERCONNECTS

BACKGROUND

The present invention generally relates to forming interconnects in an interlayer dielectric (ILD) layer with thin dielectric spacers, and more particularly to fabricating rigid interconnects without dielectric flop over.

A back-end-of-line (BEOL) portion of a semiconductor device fabrication process involves forming the conductive interconnections that can be between individual devices. The BEOL processes can include forming insulating dielectric layers, vias, metal lines, and contact pads. The spacing of the metal lines can determine the density of the individual devices on a region of a semiconductor die.

SUMMARY

In accordance with an embodiment of the present invention, a method of forming interconnects is provided. The method includes forming a plurality of mandrels on an interlayer dielectric (ILD) layer. The method further includes forming sidewall spacers on opposite sides of the each mandrel, wherein a portion of the ILD layer is exposed between adjacent sidewall spacers on adjacent mandrels, and removing the exposed portions of the ILD layer to form a first set of trenches between adjacent sidewall spacers. The method further includes forming a first set of interconnects in the first set of trenches, and removing the mandrels to expose portions of the ILD layer between the sidewall spacers. The method further includes removing the exposed portions of the ILD layer to form a second set of trenches between the sidewall spacers, and forming a second set of interconnects in the second set of trenches.

In accordance with another embodiment of the present invention, a method of forming interconnects is provided. The method includes forming a plurality of mandrels on an interlayer dielectric (ILD) layer, wherein the ILD sections are made of a dielectric material having a Young's modulus equal to or greater than 1 GPa, and forming sidewall spacers on opposite sides of the each mandrel, wherein a portion of the ILD layer is exposed between adjacent sidewall spacers on adjacent mandrels. The method further includes removing the exposed portions of the ILD layer to form a first set of trenches between adjacent sidewall spacers, and ILD sections beneath the sidewall spacers, and forming a first set of interconnects in the first set of trenches, wherein the first set of interconnects include first conductive sections. The method further includes removing the mandrels to expose portions of the ILD layer between the sidewall spacers, and removing the exposed portions of the ILD layer to form a second set of trenches between the sidewall spacers, and ILD spacers between the second set of trenches and the first set of interconnects. The method further includes forming a second set of interconnects in the second set of trenches, wherein the second set of interconnects include second conductive sections.

In accordance with yet another embodiment of the present invention, a plurality of interconnects on a substrate is provided. The plurality of interconnects includes an interlayer dielectric (ILD) spacer on the substrate, and a first barrier section on a first sidewall of the ILD spacer. The plurality of interconnects further includes a second barrier section on a second sidewall of the ILD spacer opposite the first sidewall, and a first liner section on the first barrier section. The plurality of interconnects further includes a second liner section on the second barrier section, a first conductive section on the first barrier section, and a second conductive section on the second barrier section.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Embodiments of the present invention relate to fabricating rigid interconnects without dielectric flop over, where narrow dielectric spacers fail to maintain a defined distance of separation when forming interconnects. Induced stresses can cause the dielectric spacers to move towards or away from each other causing variations in metal interconnect thicknesses. In damascene-based BEOL interconnects, the dielectric that separates between the metal lines becomes mechanically weaker as the spacing between the metal lines reduces. This weak dielectric is susceptible to wiggling/flopping over during the metallization process.

Line wiggling or line CD variability/flopping over can be caused by a metal fill at a smaller pitch due to reduced thickness/stiffness of an intervening dielectric spacer. The widths of neighboring metal lines can vary causing different electrical performance of electrical devices (e.g., transistors) on a region of a substrate. Reduced line CD variability can allow metal line formation at tighter pitches, which can depend on the Young's modulus of the materials used.

Embodiments of the present invention provide a sequential process of forming two sets of interleaved metal lines in a metallization layer. Forming the adjacent metal lines in two steps allows thicker dielectric spacers during a first formation process and filled intervening trenches during a second formation process, which avoids empty trenches that can deform during a conductive material fill process.

In one or more embodiments, during a first formation process, trenches with the desired width but with larger spacing could be formed in the dielectric and filled with conductive material, and during a second formation process the remaining population of trenches could be created and filled with a conductive material to form the final dense metal line structures. Patterning can be done using any known patterning approaches, such as self alignment double patterning (SADP), Litho-Etch-Litho-Etch (LELE), and self aligned Litho-Etch-Litho-Etch (SA-LELE). Different conductive materials can be used for the first and second formation processes.

Exemplary applications/uses to which the present invention can be applied include, but are not limited to: logic devices with closely spaced metal lines, memory devices with closely spaced metal lines, etc.

It is to be understood that aspects of the present invention will be described in terms of a given illustrative architecture; however, other architectures, structures, substrate materials and process features and steps can be varied within the scope of aspects of the present invention.

Figure 1:
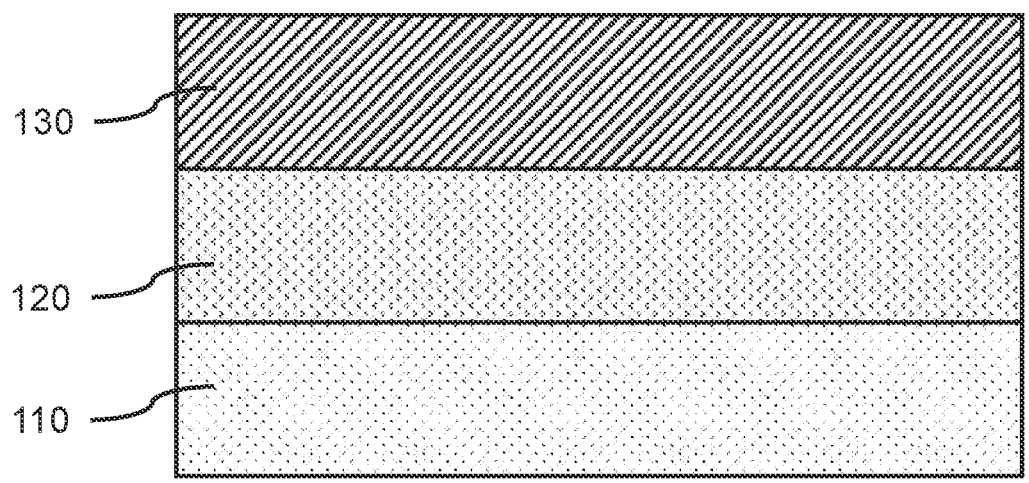
FIG. 1 is a cross-sectional view showing an interlayer dielectric (ILD) layer on a substrate, and a mandrel layer on the ILD layer, in accordance with an embodiment of the present invention.

Referring now to the drawings in which like numerals represent the same or similar elements and initially to FIG. 1, where FIG. 1 is a cross-sectional view showing an interlayer dielectric (ILD) layer on a substrate, and a mandrel layer on the ILD layer, in accordance with an embodiment of the present invention.

In one or more embodiments, an interlayer dielectric (ILD) layer 120 can be formed on a substrate 110, where the interlayer dielectric (ILD) layer 120 can be formed by a conformal deposition, for example, atomic layer deposition (ALD), or a blanket deposition, for example, chemical vapor deposition (CVD).

In various embodiments, the interlayer dielectric (ILD) layer 120 can have a thickness in a range of about 10 nanometers (nm) to about 100 nm, or about 15 nm to about 80 nm, or about 20 nm to about 60 nm, although other thicknesses are also contemplated.

In various embodiments, the interlayer dielectric (ILD) layer 120 can be a dielectric material, including, but not limited to, silicon oxide (SiO), silicon nitride (SiN), silicon oxynitride (SiON), silicon carbide (SiC), silicon oxycarbide (SiOC), a low-k dieletric material, and combinations thereof. A low-k dielectric material can be, for example, spin-on glass (SiCOH), carbon doped silicon oxide (SiO:C, CDO), fluorine doped silicon oxide (SiO:F), porous silicon dioxide (p-$SiO_2$), spin-on dielectric materials (e.g., hydrogen silsesquioxane, methylsilsesquioxane, etc.), and combinations thereof.

In one or more embodiments, a mandrel layer 130 can be formed on the ILD layer 120, where the mandrel layer 130 can be formed by a conformal deposition, for example, atomic layer deposition (ALD), or a blanket deposition, for example, chemical vapor deposition (CVD).

In various embodiments, the interlayer dielectric (ILD) layer 120 can have a thickness in a range of about 10 nm to about 100 nm, or about 15 nm to about 80 nm, or about 20 nm to about 60 nm, although other thicknesses are also contemplated.

In various embodiments, the mandrel layer 130 can be a dielectric hardmask material, including, but not limited to, silicon oxide (SiO), silicon nitride (SiN), silicon oxynitride (SiON), silicon carbide (SiC), silicon oxycarbide (SiOC), and combinations thereof.

Figure 2:
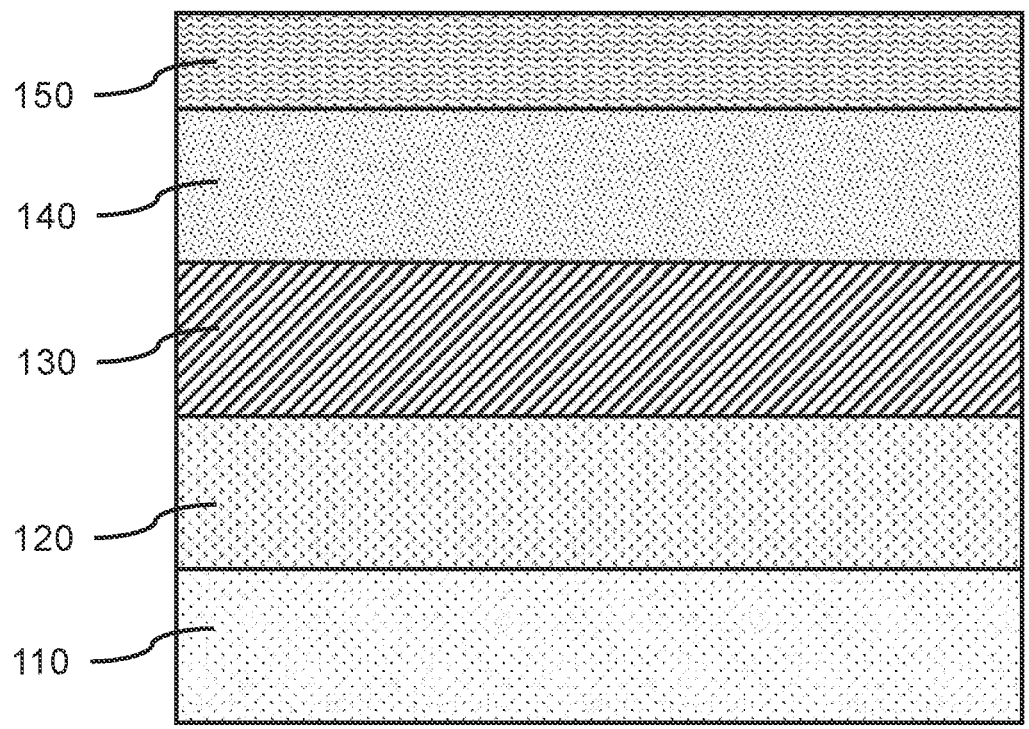
FIG. 2 is a cross-sectional view showing a hardmask layer on the mandrel layer and a resist layer on the hardmask layer, in accordance with an embodiment of the present invention.

FIG. 2 is a cross-sectional view showing a hardmask layer on the mandrel layer and a resist layer on the hardmask layer, in accordance with an embodiment of the present invention.

In one or more embodiments, a hardmask layer 140 can be formed on the mandrel layer 130, where the hardmask layer 140 can be formed by a conformal deposition, for example, atomic layer deposition (ALD), or a blanket deposition, for example, chemical vapor deposition (CVD).

In various embodiments, the hardmask layer 140 can be a dielectric hardmask material, including, but not limited to, silicon oxide (SiO), silicon nitride (SiN), silicon oxynitride (SiON), silicon carbide (SiC), silicon oxycarbide (SiOC), titanium nitride (TiN), titanium oxide (TiO), and combinations thereof. The hardmask layer 140 can be a different hardmask material from the mandrel layer 130, so the hardmask layer 140 can be selectively removed.

In one or more embodiments, a resist layer 150 can be formed on the hardmask layer 140, where the resist layer 150 can be formed by a blanket deposition, including a spin-on process. The resist layer 150 can be a photolithographic resin material that can be patterned and processed.

Figure 3:
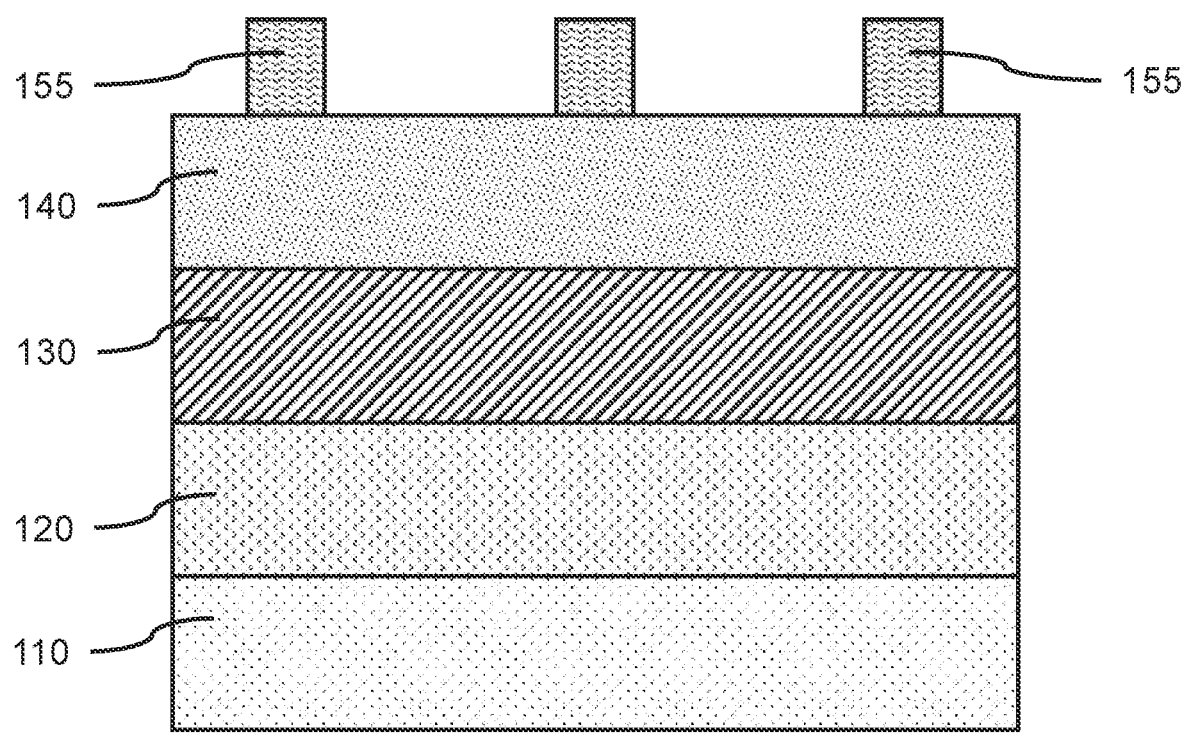
FIG. 3 is a cross-sectional view showing a plurality of resist templates patterned on the hardmask layer, in accordance with an embodiment of the present invention.

FIG. 3 is a cross-sectional view showing a plurality of resist templates patterned on the hardmask layer, in accordance with an embodiment of the present invention.

In one or more embodiments, the resist layer 150 can be patterned to form one or more resist templates 155 on the hardmask layer 140, where the resist layer 150 can be patterned using lithographic processes and etching to expose portion of the hardmask layer 140.

In various embodiments, the resist templates 155 can have a width in a range of about 5 nanometers (nm) to about 50 nm, or about 10 nm to about 30 nm. or about 15 nm to about 20 nm, although other widths are also contemplated. The width of the resist templates 155 can determine the width of an underlying metal line.

Figure 4:
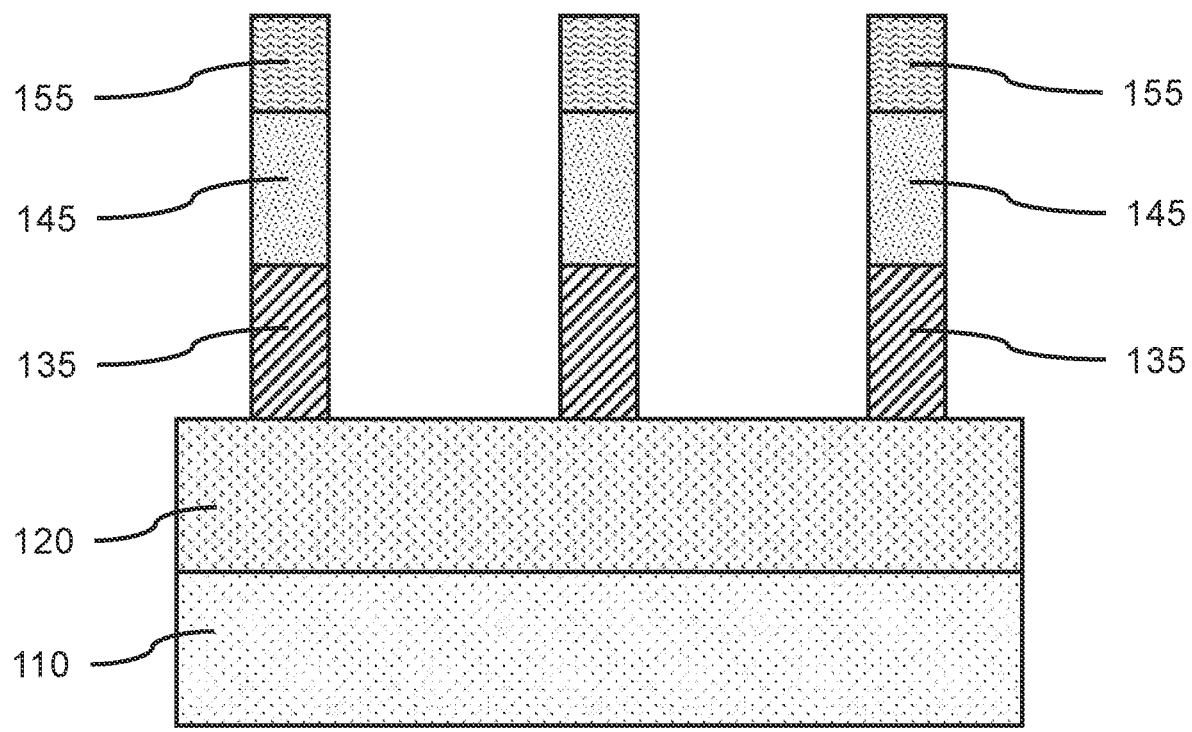
FIG. 4 is a cross-sectional view showing a plurality of resist templates and mandrel templates on a plurality of patterned mandrels, in accordance with an embodiment of the present invention.

FIG. 4 is a cross-sectional view showing a plurality of resist templates and mandrel templates on a plurality of patterned mandrels, in accordance with an embodiment of the present invention.

In one or more embodiments, the pattern of the resist templates 155 can be transferred to the underlying hardmask layer 140 by a selective directional etch, for example, a reactive ion etch (RIE), where exposed portion of the hardmask layer 140 can be removed down to the top surface of the mandrel layer 130. Removal of the exposed portions of the hardmask layer 140 can form mandrel templates 145 on the underlying mandrel layer 130.

In one or more embodiments, the pattern of the resist templates 155 can be transferred to the underlying mandrel layer 130 by a selective directional etch, for example, a reactive ion etch (RIE), where exposed portion of the mandrel layer 130 can be removed down to the top surface of the interlayer dielectric (ILD) layer 120. Removal of the exposed portion of the mandrel layer 130 can form a plurality of mandrels 135 on the ILD layer 120 and expose the top surface of the ILD layer 120 between the mandrels.

In various embodiments, the mandrels 135 can have a width in a range of about 5 nanometers (nm) to about 50 nm, or about 10 nm to about 30 nm. or about 15 nm to about 20 nm, although other widths are also contemplated. The width of the resist templates 155 can determine the width of mandrels 135.

In various embodiments, the mandrels 135 can have a length in a range of about 1 nm to about 100,000 nm, or about 10 nm to about 10,000 nm. or about 100 nm to about 1000 nm, although other lengths are also contemplated.

Figure 5:
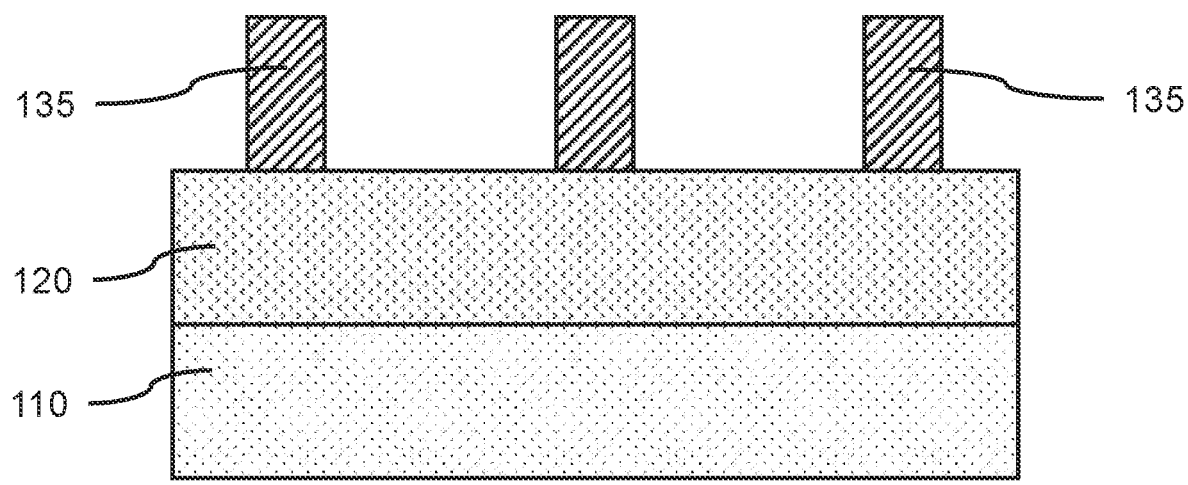
FIG. 5 is a cross-sectional view showing a plurality of mandrels on the ILD layer after removing the resist templates and mandrel templates, in accordance with an embodiment of the present invention.

FIG. 5 is a cross-sectional view showing a plurality of mandrels on the ILD layer after removing the resist templates and mandrel templates, in accordance with an embodiment of the present invention.

In one or more embodiments, the resist templates 155 and mandrel templates 145 can be removed from the mandrels 135 using selective etches (e.g., wet chemical etches, dry plasma etches).

The positioning and distance between adjacent mandrels can determine the location of a second set conductive sections interspersed between a first set of conductive sections.

Figure 6:
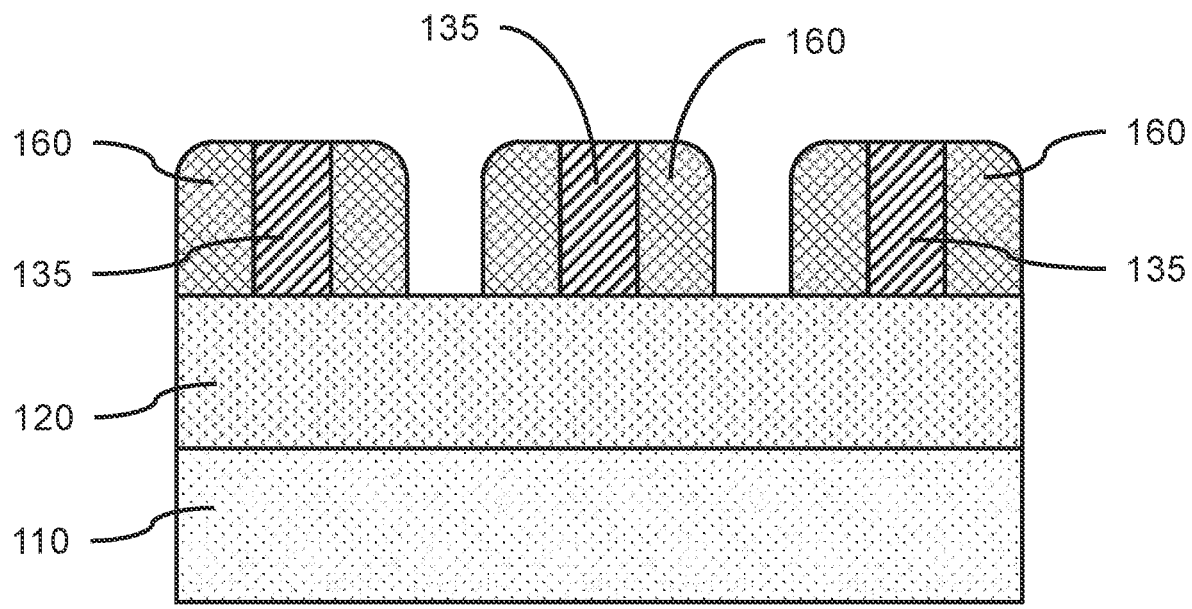
FIG. 6 is a cross-sectional view showing sidewall spacers formed on each of the patterned mandrels, in accordance with an embodiment of the present invention.

FIG. 6 is a cross-sectional view showing sidewall spacers formed on each of the patterned mandrels, in accordance with an embodiment of the present invention.

In various embodiments, a sidewall spacer layer can be formed on the mandrels 135 and exposed surface(s) of the ILD layer 120, where the sidewall spacer layer can be formed by a conformal deposition to provide uniform thicknesses are both sides of the mandrels 135.

In various embodiments, portions of the sidewall spacer layer can be removed, for example, using a selective, directional etch, that forms sidewall spacers 160 on opposite sides of the each mandrel 135 and exposes portions of the ILD layer between facing sidewall spacers 160. The exposed portions of the ILD layer 120 can form a gap between the sidewall spacers 160 having a predetermined width.

In various embodiments, the sidewall spacers 160 can have a width in a range of about 5 nm to about 50 nm, or about 10 nm to about 30 nm. or about 15 nm to about 20 nm, although other widths are also contemplated. The positioning and distance between adjacent sidewall spacers on adjacent mandrels can determine the width, separation, and position of a first set of conductive sections.

In various embodiments, the gaps can have a width in a range of about 5 nm to about 50 nm, or about 10 nm to about 30 nm. or about 15 nm to about 20 nm, although other widths are also contemplated. The width of the gaps can determine the width of a first set of trenches to be formed in the ILD layer.

Figure 7:
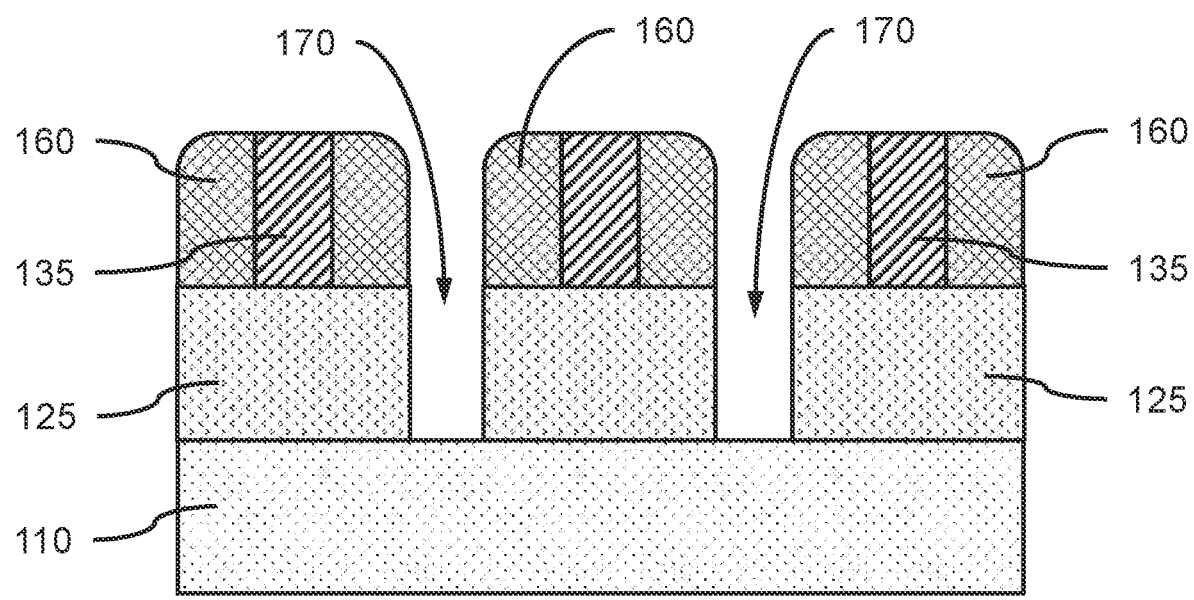
FIG. 7 is a cross-sectional view showing a first set of trenches formed into the ILD layer between the sidewall spacers on adjacent mandrels to form interlayer dielectric (ILD) sections, in accordance with an embodiment of the present invention.

FIG. 7 is a cross-sectional view showing a first set of trenches formed into the ILD layer between the sidewall spacers on adjacent mandrels to form interlayer dielectric (ILD) sections, in accordance with an embodiment of the present invention.

In one or more embodiments, the portions of the ILD layer exposed in the gaps between the sidewall spacers 160 can be removed using a selective, directional etch (e.g., RIE) to form a trench 170 between each adjacent pair of sidewall spacers 160 and interlayer dielectric (ILD) sections 125 beneath a mandrel 135 and sidewall spacers 160. The first set of trenches can be formed into the ILD layer between adjacent sidewall spacers 160 on adjacent mandrels 135.

In various embodiments, the trenches 170 can have a width in a range of about 5 nm to about 50 nm, or about 10 nm to about 30 nm. or about 15 nm to about 20 nm, although other widths are also contemplated. The width of the trenches can determine the width of the first set of conductive plugs formed in the interlayer dielectric (ILD) layer 120, which can also determine the aspect ratio and separation distance of the conductive plugs in combination with the trench depth and sidewall spacer width. The trench(es) 170 can extend a distance along the direction of the mandrels 135 and sidewall spacers 160 to subsequently form metal lines.

Figure 8:
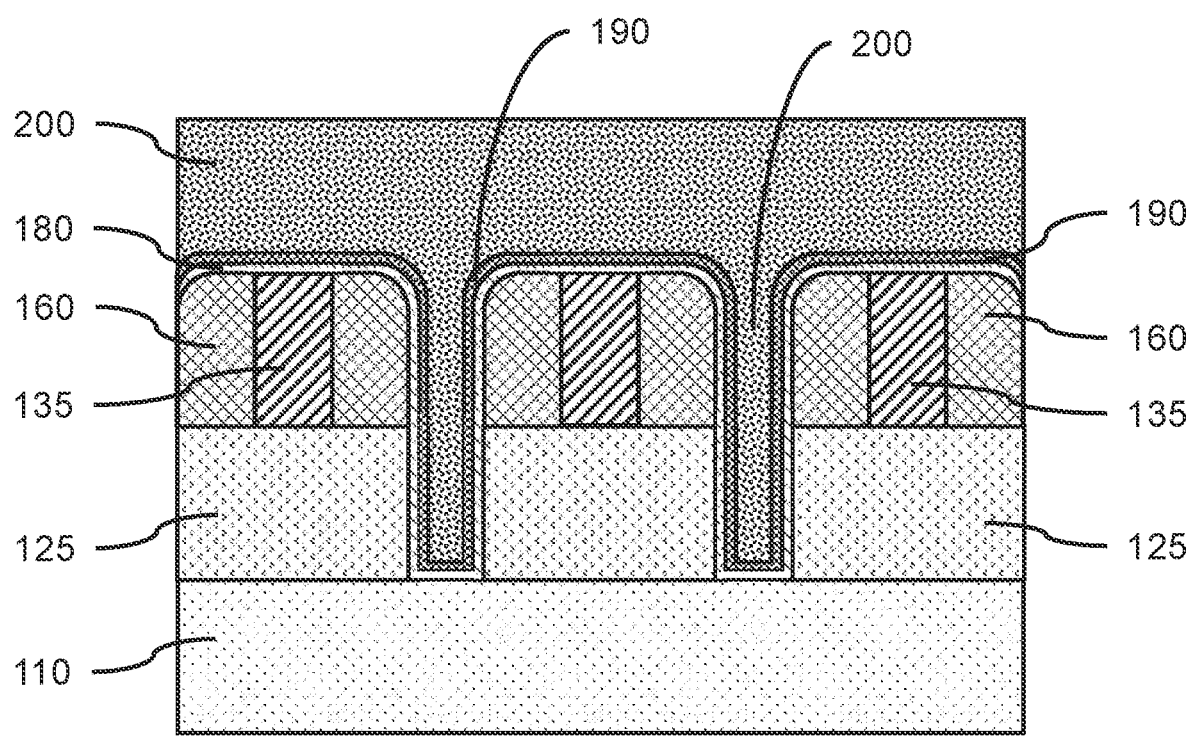
FIG. 8 is a cross-sectional view showing a first barrier layer formed in the first set of trenches and on the exposed surfaces of the sidewall spacers and mandrels, a first liner layer formed on the first barrier layer, and a first conductive fill layer formed in the first set of trenches and on the first liner layer, in accordance with an embodiment of the present invention.

FIG. 8 is a cross-sectional view showing a first barrier layer formed in the first set of trenches and on the exposed surfaces of the sidewall spacers and mandrels, a first liner layer formed on the first barrier layer, and a first conductive fill layer formed in the first set of trenches and on the first liner layer, in accordance with an embodiment of the present invention.

In one or more embodiments, a first barrier layer 180 can be formed in the first set of trenches 170 and on the exposed surfaces of the mandrels 135 and sidewall spacers 160, where the first barrier layer 180 can be formed using a conformal deposition, for example, atomic layer deposition (ALD) or plasma enhanced ALD (PEALD).

In various embodiments, the first barrier layer 180 can be a metal, for example, molybdenum (Mo), Ruthenium (Ru), tantalum (Ta), a metal compound, for example, tantalum nitride (TaN), tantalum carbide (TaC), titanium nitride (TiN), titanium carbide (TiC), or a combination thereof. The material of the first barrier layer 180 can provide a diffusion barrier to materials subsequently deposited to form a conductive line in the trench(es) 170.

In various embodiments, the first barrier layer 180 can have a thickness in a range of about 0.5 nm to about 5 nm, or about 1 nm to about 3 nm. or about 1 nm to about 2 nm, although other thicknesses are also contemplated. The first barrier layer 180 can be sufficiently thick to prevent or reduce diffusion of the material of a first conductive fill layer into surrounding dielectric material.

In one or more embodiments, a first liner layer 190 can be formed on the first barrier layer 180 in the first set of trenches 170, where the first liner layer 190 can be formed using a conformal deposition, for example, atomic layer deposition (ALD) or plasma enhanced ALD (PEALD).

In various embodiments, the first liner layer 190 can be a metal, for example, cobalt (Co) or ruthenium (Ru), a metal alloy, for example, cobalt-ruthenium (Co—Ru), or a combination thereof, including multiple layers.

In various embodiments, the first liner layer 190 can have a thickness in a range of about 0.5 nm to about 5 nm, or about 1 nm to about 3 nm. or about 1 nm to about 2 nm, although other thicknesses are also contemplated. The thickness of the first liner layer 190 can be sufficient to cover the surface of the of the first barrier layer 180 to provide a uniform surface for enhanced seed coverage for a conductive fill material, and improve the adhesion between barrier layer 180 and a conductive fill layer.

In one or more embodiments, a first conductive fill layer 200 can be formed on the first liner layer 190, where the first conductive fill layer 200 can fill in the first set of trenches 170 using a conformal deposition or a blanket deposition that does not pinch off the trenches 170. The first conductive fill layer 200 can fill in the space between sidewalls of the first liner layer 190 in trench(es) 170. The first conductive fill layer 200 can extend above the mandrels 135 and sidewall spacers 160 to form an overlying layer.

In various embodiments, the first conductive fill layer 200 can be a conductive material, including, but not limited to, tungsten (W), copper (Cu), cobalt (Co), ruthenium (Ru), aluminum (Al), molybdenum (Mo), rhenium (Re), platinum (Pt), rhodium (Rh), iridium (Jr), and combinations thereof.

Because the spacing between the trenches 170 is large enough, the interlayer dielectric (ILD) sections 125 will not flop over, and the first conductive fill layer 200 will have a consistent width/critical dimension (CD) between the ILD sections 125.

Figure 9:
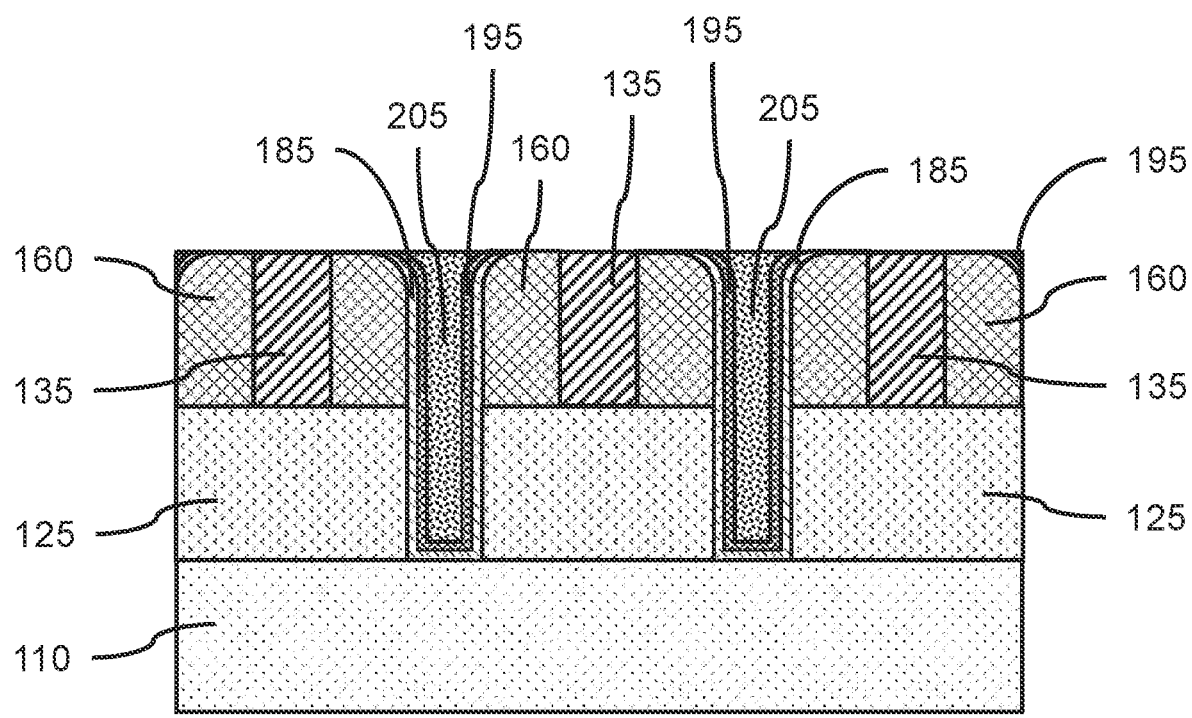
FIG. 9 is a cross-sectional view showing planarization of the first conductive fill layer, and the first liner layer and first barrier layer on the sidewall spacers and mandrels to form a conductive plug with a barrier segment and liner segment in each of the trenches, in accordance with an embodiment of the present invention.

FIG. 9 is a cross-sectional view showing planarization of the first conductive fill layer, and the first liner layer and first barrier layer on the sidewall spacers and mandrels to form a conductive plug with a barrier segment and liner segment in each of the trenches, in accordance with an embodiment of the present invention.

In one or more embodiments, the portions of the first conductive fill layer 200, first liner layer 190, and first barrier layer 180 can be removed, where the first conductive fill layer 200, first liner layer 190, and first barrier layer 180 can be removed using a chemical-mechanical polishing (CMP) that exposes underlying surfaces of the mandrels 135 and sidewall spacers 160. The remaining portion of the first conductive fill layer 200 in the trench(es) 170 and between the sidewall spacers 160 can form a conductive plug 205, a liner segment 195, and a barrier segment 185 in the trench (es) 170.

Figure 10:
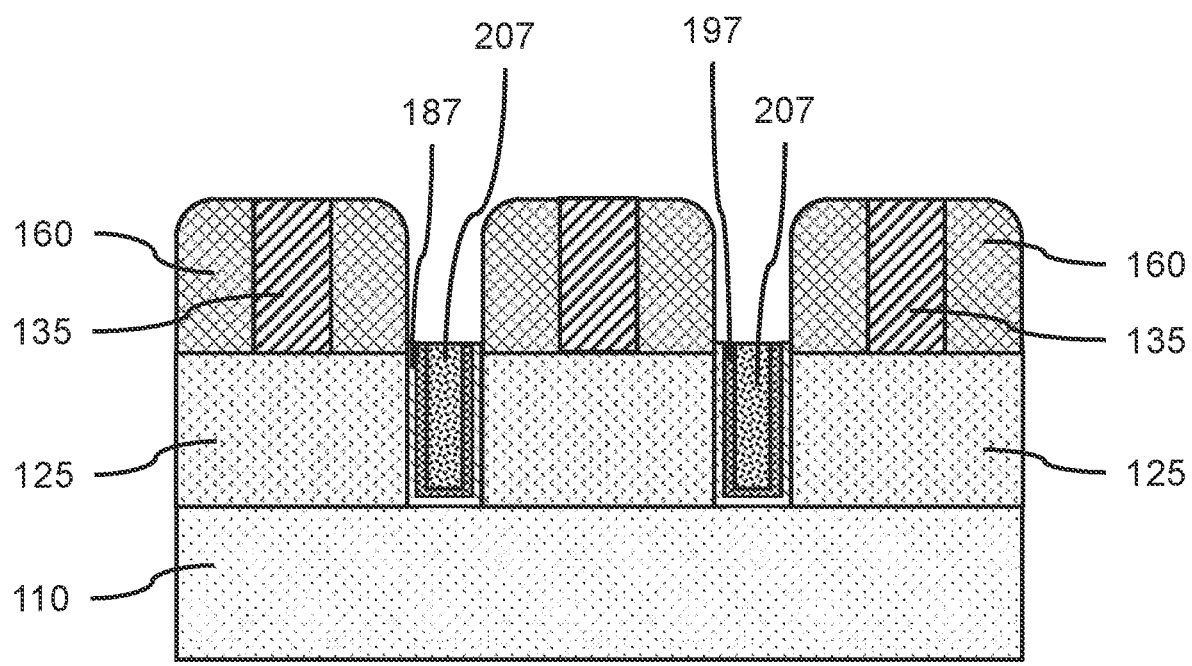
FIG. 10 is a cross-sectional view showing recessing of the conductive plugs, barrier segments, and liner segments in each of the first set of trenches to form an interconnect in each of the trenches, in accordance with an embodiment of the present invention.

FIG. 10 is a cross-sectional view showing recessing of the conductive plugs, barrier segments, and liner segments in each of the first set of trenches to form an interconnect in each of the trenches, in accordance with an embodiment of the present invention.

In one or more embodiments, the conductive plug 205, liner segment 195, and barrier segment 185 in the trench(es) 170 can be recessed using, for example, selective, directional etches (e.g., RIE) to form an interconnect (e.g., metal line) in each of the trenches. Each interconnect can include a conductive section 207 on a liner section 197, and a barrier section 187. A top surface of the conductive section 207 can be between a top surface of the interlayer dielectric (ILD) sections 125 and the top surface of the adjacent mandrel 135, or above a top surface of the adjoining ILD sections 125 and below the middle of the sidewall spacers 160. A wet metal recess process can be used as well as an RIE process.

Figure 11:
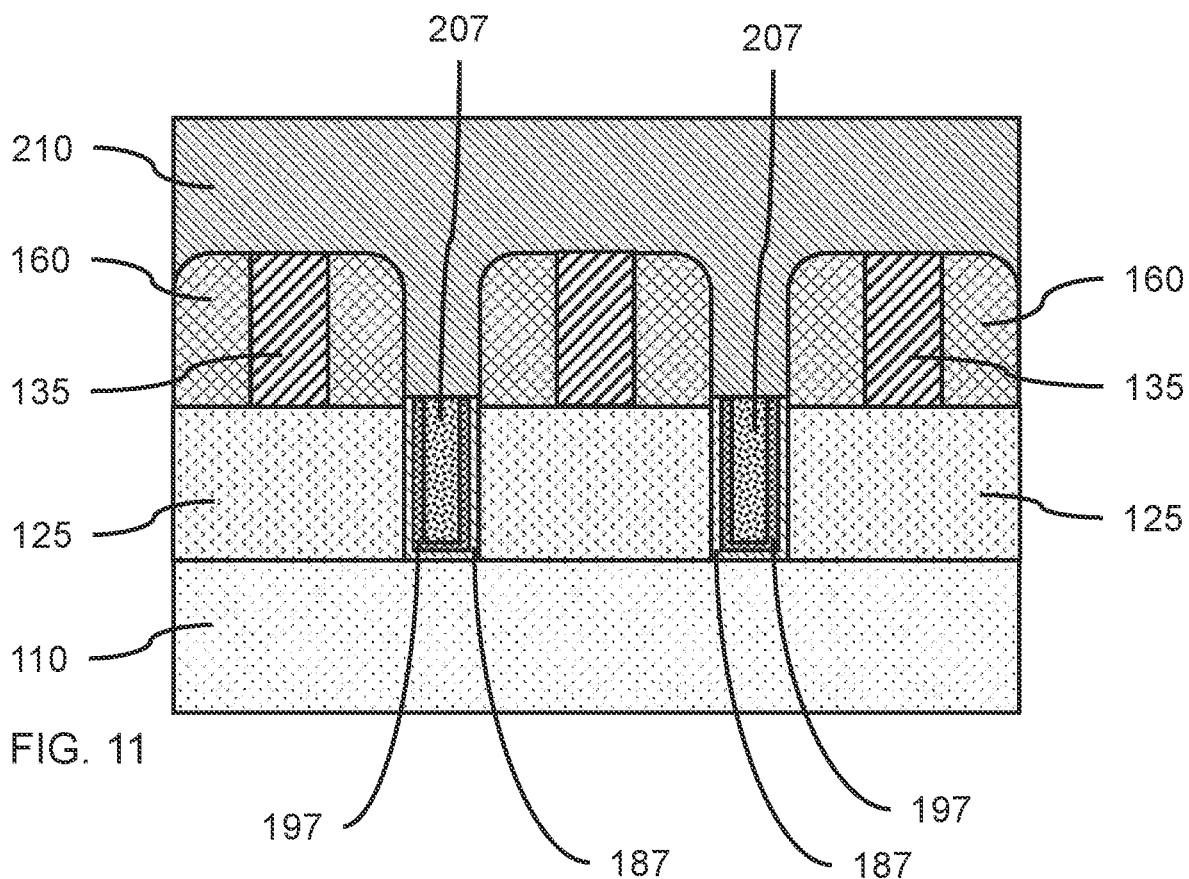
FIG. 11 is a cross-sectional view showing formation of a protective layer on the mandrels, sidewall spacers, and interconnects, in accordance with an embodiment of the present invention.

FIG. 11 is a cross-sectional view showing formation of a protective layer on the mandrels, sidewall spacers, and interconnects, in accordance with an embodiment of the present invention.

In one or more embodiments, a protective layer 210 can be formed on the mandrels 135, sidewall spacers 160, and in the trenches 170 above the interconnects (conductive section 207, liner section 197, barrier section 187). The protective layer 210 can fill in the trenches 170 and extend above the mandrels 135 and sidewall spacers 160.

In various embodiments, the protective layer 210 can be a metal compound hardmask material, including, but not limited to, a metal carbide, for example, tantalum carbide (TaC), titanium carbide (TiC), a metal nitride, for example, tantalum nitride (TaN), titanium nitride (TiN), and combinations thereof.

Figure 12:
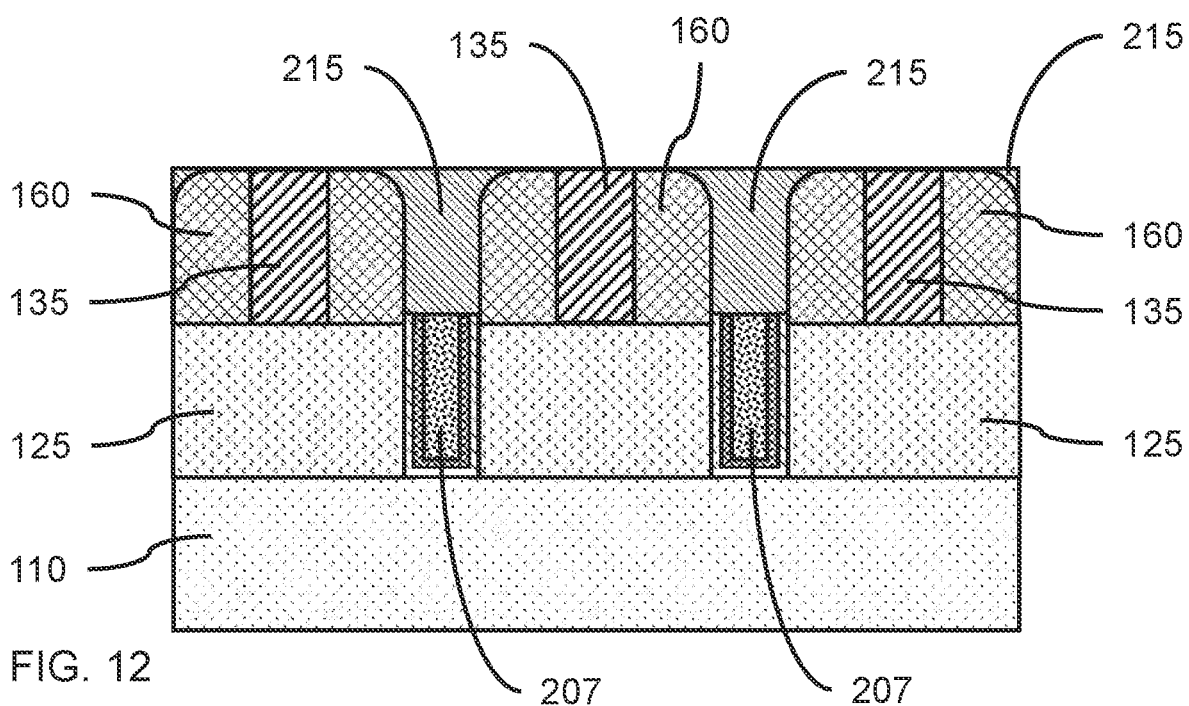
FIG. 12 is a cross-sectional view showing planarization of the protective layer on the mandrels and sidewall spacers forming protective plugs on the interconnects in the first set of trenches, in accordance with an embodiment of the present invention.

FIG. 12 is a cross-sectional view showing planarization of the protective layer on the mandrels and sidewall spacers forming protective plugs on the interconnects in the first set of trenches, in accordance with an embodiment of the present invention.

In one or more embodiments, the portion of the protective layer 210 extending above the mandrels 135 and sidewall spacers 160 can be removed using, for example, CMP to expose a top surface of the mandrels 135 and sidewall spacers 160. Removal of the portion of the protective layer 210 can form protective plugs 215 on the interconnects.

Figure 13:
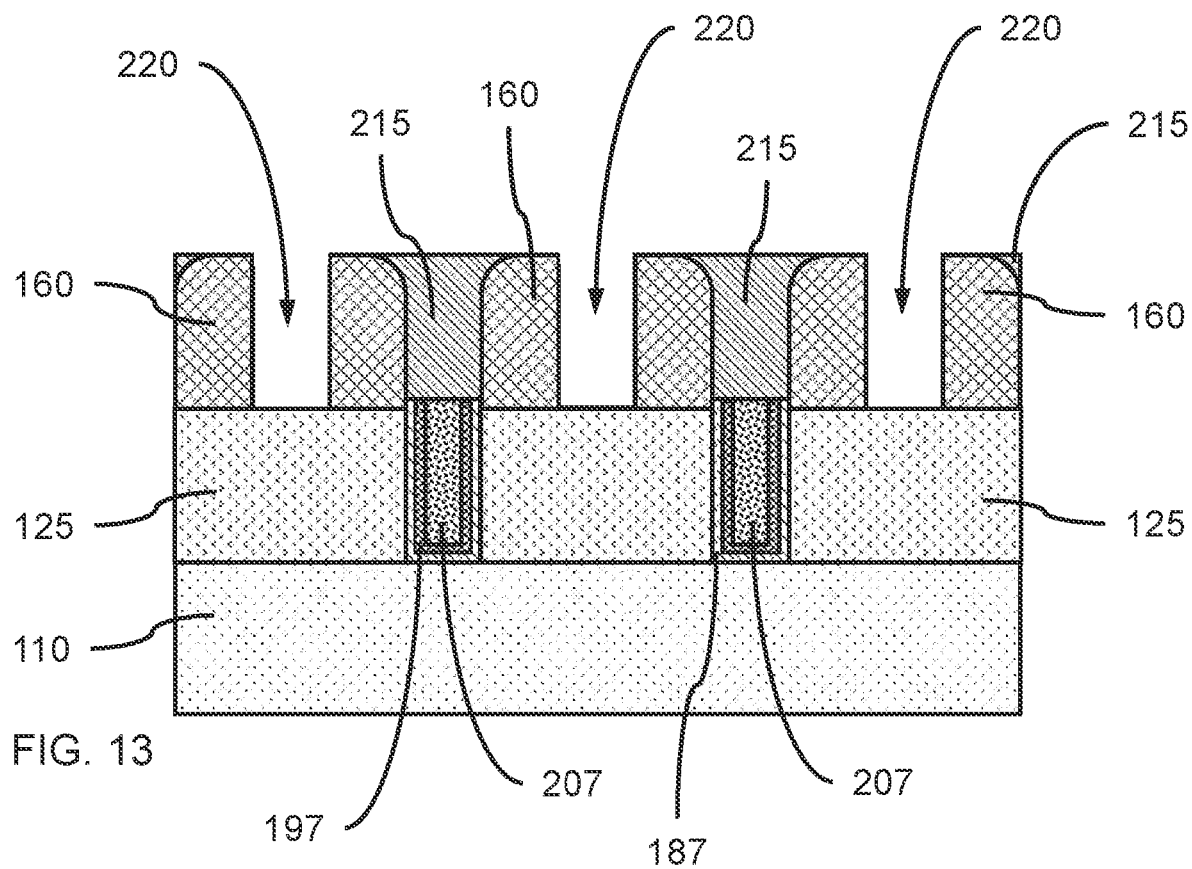
FIG. 13 is a cross-sectional view showing removal of the mandrels from between the sidewall spacers to form second gaps, in accordance with an embodiment of the present invention.

FIG. 13 is a cross-sectional view showing removal of the mandrels from between the sidewall spacers to form second gaps, in accordance with an embodiment of the present invention.

In one or more embodiments, the mandrels 135 can be removed from between the sidewall spacers 160 to form gaps 220 between the sidewall spacers 160. The mandrels can be removed with a selective etch, for example a selective isotropic etch (e.g., wet chemical etch, dry plasma etch), a selective, directional etch (e.g., RIE) or a combination thereof. Removal of the mandrels 135 can expose the underlying surface of the ILD section 125.

In various embodiments, the gaps 220 can have a width in a range of about 5 nm to about 50 nm, or about 10 nm to about 30 nm. or about 15 nm to about 20 nm, although other widths are also contemplated. The width of the gap can be the same as the width of the removed mandrel 135.

Figure 14:
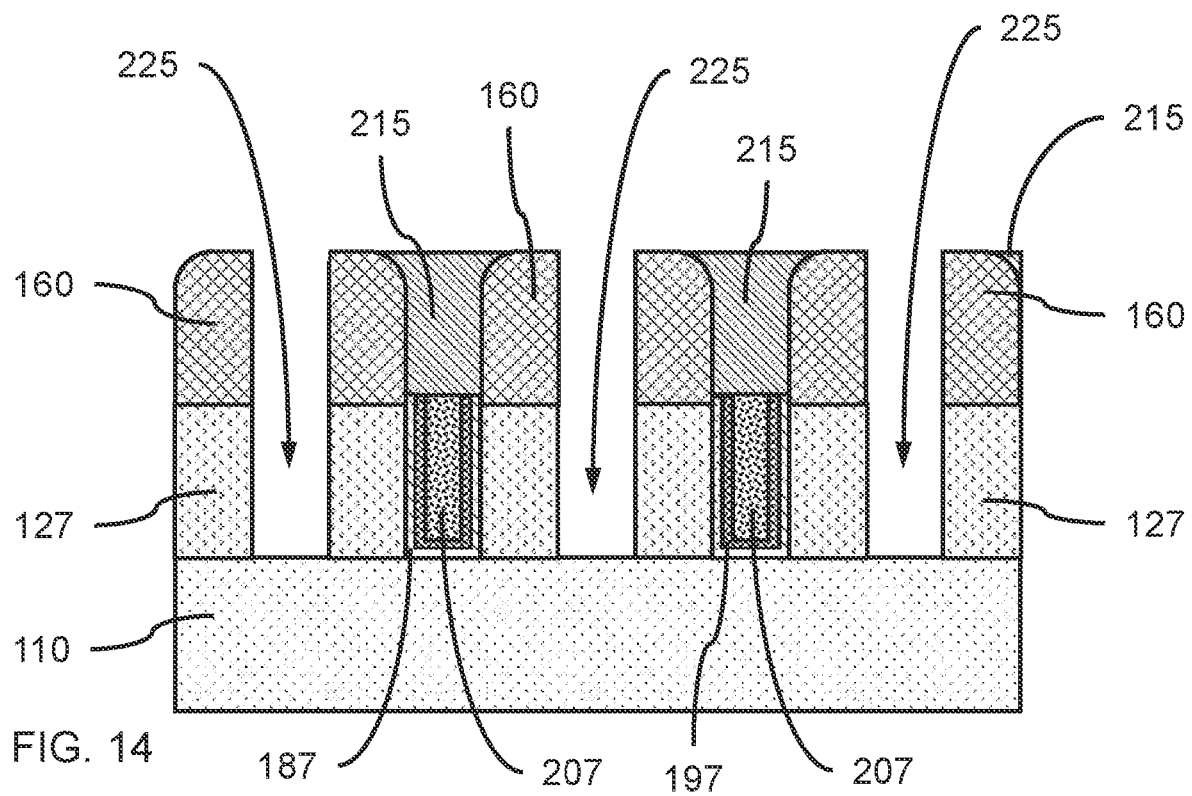
FIG. 14 is a cross-sectional view showing removal of portions of the ILD sections from between adjacent sidewall spacers to form a second set of trenches between ILD spacers, in accordance with an embodiment of the present invention.

FIG. 14 is a cross-sectional view showing removal of portions of the ILD sections from between adjacent sidewall spacers to form a second set of trenches between ILD spacers, in accordance with an embodiment of the present invention.

In one or more embodiments, the portions of the ILD section(s) 125 exposed in the gaps 220 between the sidewall spacers 160 can be removed using a selective, directional etch (e.g., RIE) to form a second trench 225 between each adjacent pair of sidewall spacers 160 and form an interlayer dielectric (ILD) spacer 127 beneath each of the adjacent sidewall spacers 160.

In various embodiments, the second trenches 225 can have a width in a range of about 5 nm to about 50 nm, or about 10 nm to about 30 nm. or about 15 nm to about 20 nm, although other widths are also contemplated. The width of the gap can be the same as the width of the mandrel 135.

In various embodiments, the ILD spacers 127 can have a width in a range of about 5 nm to about 50 nm, or about 10 nm to about 30 nm. or about 15 nm to about 20 nm, although other widths are also contemplated. The width of the ILD spacers 127 can be the same as the width of the sidewall spacers 160.

The ILD spacers 127 on opposite sides of an interconnect can fill the space between adjacent second trenches 225. Because the spacing between the second trenches 225 is large enough, the intervening ILD spacers 127 and conductive sections 207 will not flop over.

Figure 15:
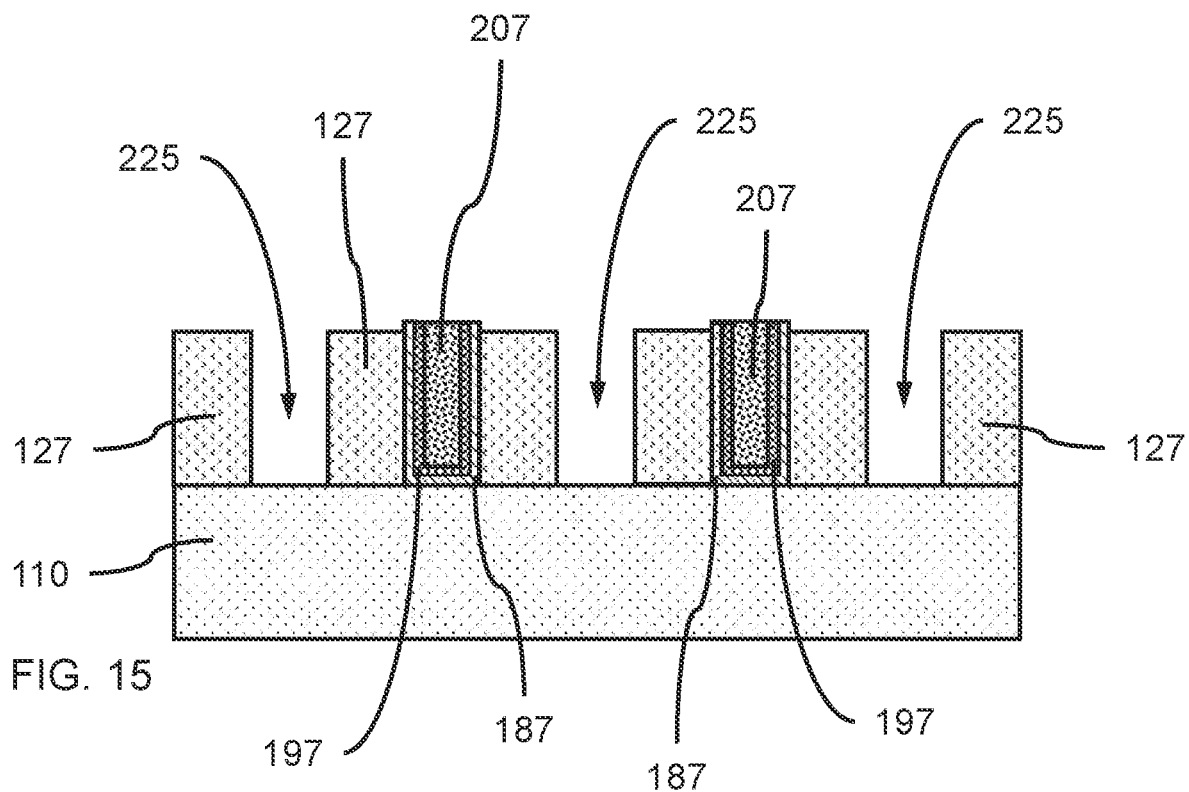
FIG. 15 is a cross-sectional view showing removal of the sidewall spacers and protective plugs, in accordance with an embodiment of the present invention.

FIG. 15 is a cross-sectional view showing removal of the sidewall spacers and protective plugs, in accordance with an embodiment of the present invention.

In one or more embodiments, the sidewall spacers 160 can be removed from the top surfaces of the ILD spacers 127, where the sidewall spacers can be removed using a selective etch. portions of the barrier section 187, liner section 197, and conductive section 207 can extend above the top surface (s) of the ILD spacers 127.

Figure 16:
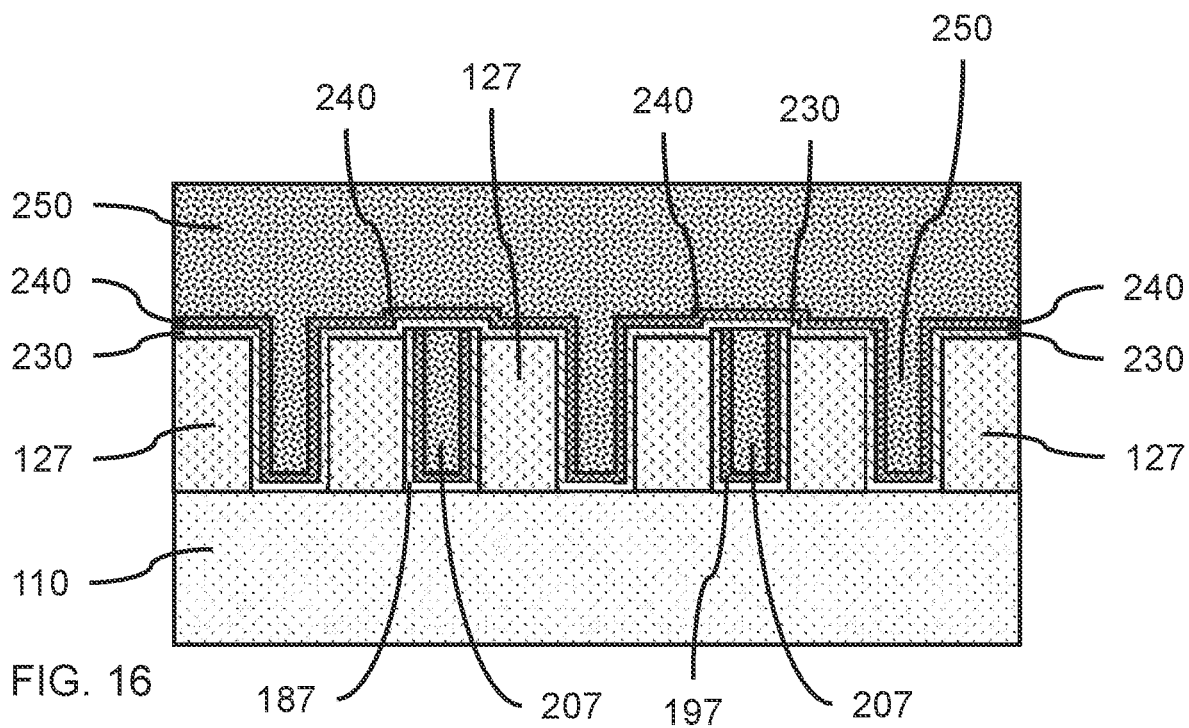
FIG. 16 is a cross-sectional view showing a second barrier layer formed in the second set of trenches and on the exposed surfaces of the ILD spacers, a second liner layer formed on the second barrier layer, and a second conductive fill layer formed in the second set of trenches and on the second liner layer, in accordance with an embodiment of the present invention.

FIG. 16 is a cross-sectional view showing a second barrier layer formed in the second set of trenches and on the exposed surfaces of the ILD spacers, a second liner layer formed on the second barrier layer, and a second conductive fill layer formed in the second set of trenches and on the second liner layer, in accordance with an embodiment of the present invention.

In one or more embodiments, a second barrier layer 230 can be formed in the second set of trenches 225 and on the exposed surfaces of the ILD spacers 127, where the second barrier layer 230 can be formed using a conformal deposition, for example, atomic layer deposition (ALD) or plasma enhanced ALD (PEALD).

In various embodiments, the second barrier layer 230 can be a metal, for example, molybdenum (Mo), Ruthenium (Ru), tantalum (Ta), a metal compound, for example, tantalum nitride (TaN), tantalum carbide (TaC), titanium nitride (TiN), titanium carbide (TiC), or a combination thereof. The material of the second barrier layer 230 can provide a diffusion barrier to materials subsequently deposited to form a conductive line in the trench(es) 225.

In various embodiments, the second barrier layer 230 can have a thickness in a range of about 0.5 nm to about 5 nm, or about 1 nm to about 3 nm. or about 1 nm to about 2 nm, although other thicknesses are also contemplated.

In one or more embodiments, a second liner layer 240 can be formed on the second barrier layer 230 in the second set of trenches 225, where the second liner layer 240 can be formed using a conformal deposition, for example, atomic layer deposition (ALD) or plasma enhanced ALD (PEALD).

In various embodiments, the second liner layer 240 can be a metal, for example, cobalt (Co) or ruthenium (Ru), a metal alloy, for example, cobalt-ruthenium (Co—Ru), or a combination thereof, including multiple layers.

In various embodiments, the second liner layer 240 can have a thickness in a range of about 0.5 nm to about 5 nm, or about 1 nm to about 3 nm. or about 1 nm to about 2 nm, although other thicknesses are also contemplated.

In one or more embodiments, a second conductive fill layer 250 can be formed on the second liner layer 240, where the second conductive fill layer 250 can fill in the second set of trenches 225 using a conformal deposition or a blanket deposition that does not pinch off the trenches 225. The second conductive fill layer 250 can fill in the space between sidewalls of the second liner layer 240 in trench(es) 225. The second conductive fill layer 250 can extend above the ILD spacers 127 to form an overlying layer.

In various embodiments, the second conductive fill layer 250 can be a conductive material, including, but not limited to, tungsten (W), copper (Cu), cobalt (Co), ruthenium (Ru), aluminum (Al), molybdenum (Mo), rhenium (Re), platinum (Pt), rhodium (Rh), iridium (Jr), and combinations thereof. The second conductive fill layer 250 can be a different conductive material from the first conductive fill layer 200 because the second conductive fill layer 250 is formed by a separate process from the first conductive fill layer 200.

Because the spacing between the second trenches 225 is large enough, the second conductive fill layer 250 will have a consistent width/critical dimension (CD).

Figure 17:
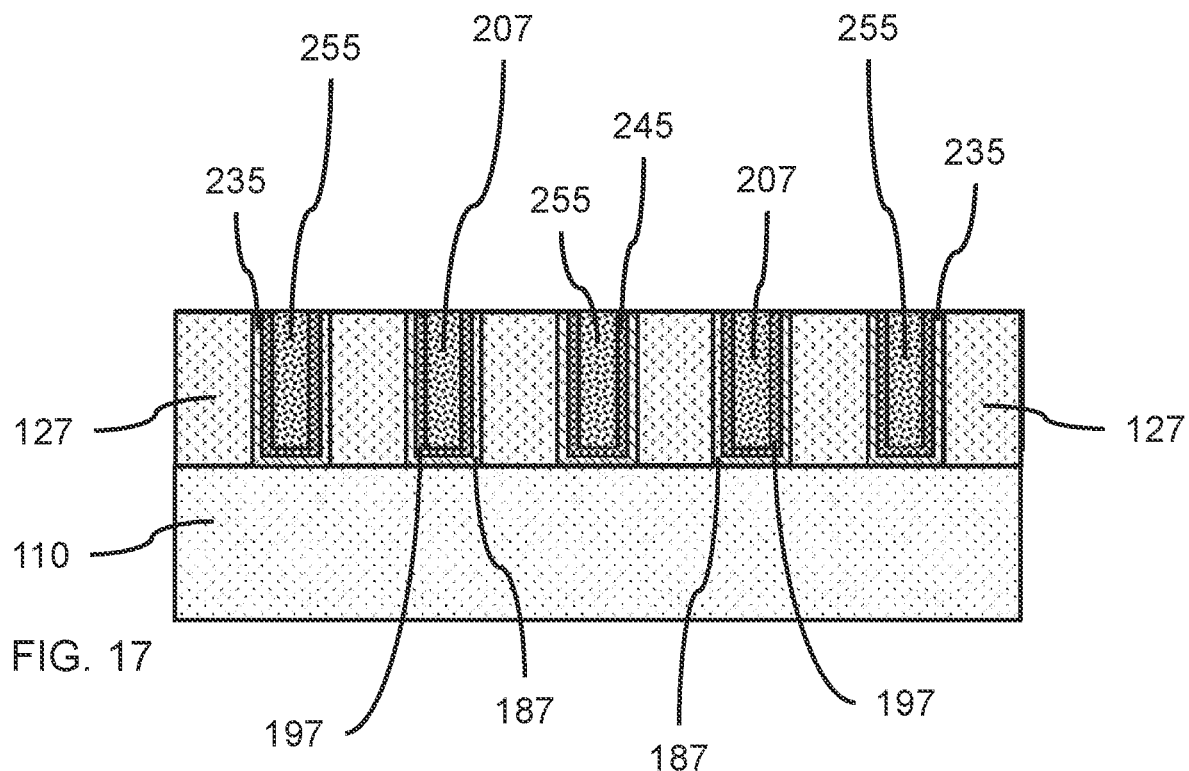
FIG. 17 is a cross-sectional view showing planarization of the second conductive fill layer, and the second liner layer and second barrier layer on the ILD spacers to form a second set of interconnects in each of the second set of trenches, in accordance with an embodiment of the present invention.

FIG. 17 is a cross-sectional view showing planarization of the second conductive fill layer, and the second liner layer and second barrier layer on the ILD spacers to form a second set of interconnects in each of the second set of trenches, in accordance with an embodiment of the present invention.

In one or more embodiments, the portions of the second conductive fill layer 250, second liner layer 240, second barrier layer 230, as well as the first conductive sections 207, first liner sections 197, and first barrier sections 187 that are above the ILD spacers 127 can be removed, for example, using a chemical-mechanical polishing (CMP) that exposes underlying surfaces of the LD spacers 127. The remaining portion of the second conductive fill layer 250, second liner layer 240, second barrier layer 230 in the trench(es) 225 can form a second set of interconnects in each of the second set of trenches 225. The second set of interconnects can include a second conductive section 255 on a second liner section 245, and a second barrier section 235 in trench(es) 225. The top surfaces of the second conductive section 255 and first conductive sections 207 can be coplanar with the top surfaces of ILD spacers 127. The second set of interconnects including the second conductive section 255 can be interleaved with the first set of interconnects including the conductive sections 207, where intervening ILD spacers 127 can separate the first set of interconnects from the second set of interconnects.

Figure 18:
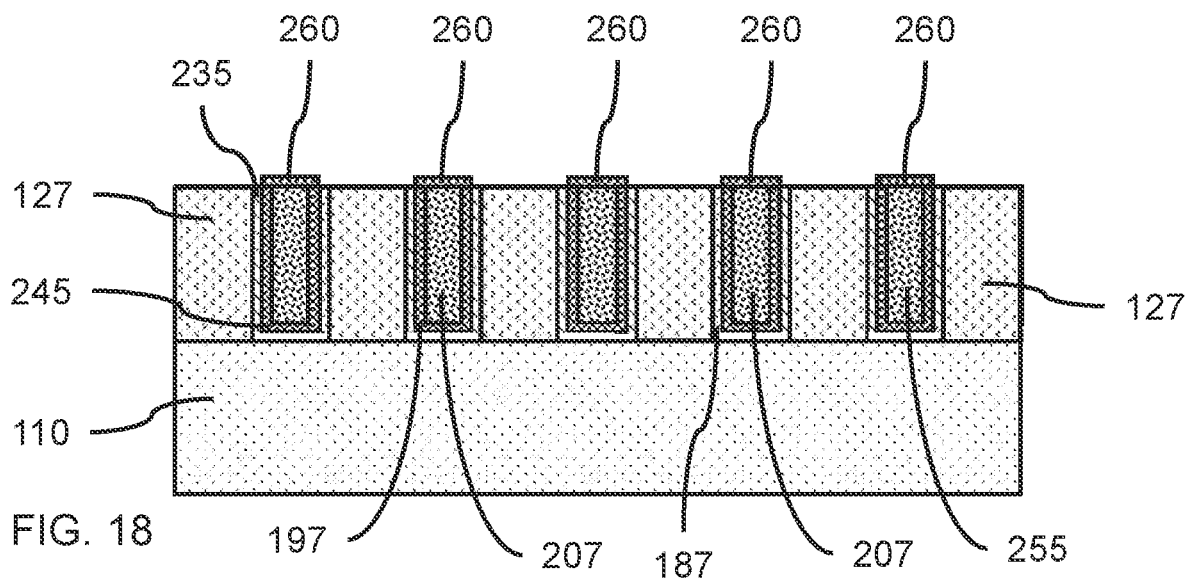
FIG. 18 is a cross-sectional view showing formation of a post metal cap on each of the interconnects in each of the trenches, in accordance with an embodiment of the present invention.

FIG. 18 is a cross-sectional view showing formation of a post metal cap on each of the interconnects in each of the trenches, in accordance with an embodiment of the present invention.

In one or more embodiments, a post metal cap 260 can be formed on each of the interconnects, where the post metal cap can be formed by an area selective deposition, for example, CVD, on the exposed top surfaces of the first conductive sections 207 and second conductive section 255. A top edge of the second barrier section 235 and a top edge of the first barrier sections 187 can be exposed around the periphery of the post metal caps 260.

In various embodiments, the post metal cap 260 can be a barrier metal, including, but not limited to cobalt (Co), ruthenium (Ru), molybdenum (Mo), tantalum (Ta), tantalum nitride (TaN), and combinations thereof.

In various embodiments, the post metal cap 260 can have a thickness in a range of about 0.5 nm to about 10 nm, or about 2 nm to about 4 nm, although other thicknesses are also contemplated. The post metal cap 260 can be sufficiently thick to improve the adhesion between conductive fill metal and dielectric cap, which results in better electromagnetic (EM) performance.

In various embodiments, the Young modulus, or the modulus of elasticity, which is a mechanical property that measures the tensile or compressive stiffness of a solid material when the force is applied lengthwise, can affect the distance between adjacent conductive sections 207, 255 by establishing the stiffness of the conductive section 207, 255 and intervening ILD spacers 127. Stiffer ILD spacers 127 can allow closer spacing between the conductive sections 207, 255 (e.g., metal lines) in a metallization layer.

The Young's modulus of dielectric materials for the ILD spacers 127 are, for example, silicon nitride ($Si_3N_4$) 166 GPa, silicon dioxide ($SiO_2$) 66.3 GPa, hafnium dioxide ($HfO_2$) 57 GPa, and silicon carbide (SiC) 90 GPa. An interlayer dielectric (ILD) layer 120 made of silicon nitride ($Si_3N_4$) 166 GPa can be used for narrower ILD spacers 127 than hafnium dioxide ($HfO_2$) 57 GPa. In various embodiments, the ILD layer, ILD sections, and ILD spacers can be made of a dielectric material having a Young's modulus equal to or greater than 1 GPA, equal to or greater than 5 GPa, or equal to or greater than 90 GPa.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates other vise. It will be further understood that the terms "comprises," "comprising," "includes" and/or "ding," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Having described preferred embodiments of a device and method of fabricating the device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming interconnects, comprising:
    forming a plurality of mandrels on an interlayer dielectric (ILD) layer;
    forming sidewall spacers on opposite sides of the each mandrel, wherein a portion of the ILD layer is exposed between adjacent sidewall spacers on adjacent mandrels;
    removing the exposed portions of the ILD layer to form a first set of trenches between adjacent sidewall spacers;
    forming a first set of interconnects in the first set of trenches;
    removing the mandrels to expose portions of the ILD layer between the sidewall spacers;
    removing the exposed portions of the ILD layer to form a second set of trenches between the sidewall spacers;
    forming a second set of interconnects in the second set of trenches, wherein the sidewall spacers and the ILD layer are each made of a material different from the mandrels; and
    forming a post metal cap on each of the first set of interconnects and the second set of interconnects.

2. The method of claim 1, wherein the first set of interconnects include a first barrier section on sidewalls of interlayer dielectric (ILD) sections, a first liner section on the first barrier sections, and a first conductive section on each first barrier section.

3. The method of claim 1, wherein the first set of trenches each have a width in a range of about 5 nm to about 50 nm.

4. The method of claim 1, wherein the second set of interconnects are separated from the first set of interconnects by interlayer dielectric (ILD) spacers.

5. The method of claim 1, further comprising forming a protective plug on each of the first set of interconnects before removing the mandrels.

6. The method of claim 5, wherein the mandrels are made of a dielectric hardmask material selected from the group consisting of silicon oxide (SiO), silicon nitride (SiN), silicon oxynitride (SiON), silicon carbide (SiC), silicon oxycarbide (SiOC), and combinations thereof.

7. The method of claim 6, wherein the protective plugs are each made of a material different from the mandrels.

8. The method of claim 6, wherein ILD sections are made of a dielectric material having a Young's modulus equal to or greater than 1 GPa.

9. The method of claim 6, wherein ILD sections are made of a dielectric material having a Young's modulus equal to or greater than 5 GPa.

10. A method of forming interconnects, comprising:
    forming a plurality of mandrels on an interlayer dielectric (ILD) layer, wherein the ILD layer is made of a dielectric material having a Young's modulus equal to or greater than 1 GPa;
    forming sidewall spacers on opposite sides of the each mandrel, wherein a portion of the ILD layer is exposed between adjacent sidewall spacers on adjacent mandrels;
    removing the exposed portions of the ILD layer to form a first set of trenches between adjacent sidewall spacers, and ILD sections beneath the sidewall spacers;
    forming a first set of interconnects in the first set of trenches, wherein the first set of interconnects include first conductive sections;
    removing the mandrels to expose portions of the ILD layer between the sidewall spacers;
    removing the exposed portions of the ILD layer to form a second set of trenches between the sidewall spacers, and ILD spacers between the second set of trenches and the first set of interconnects; and
    forming a second set of interconnects in the second set of trenches, wherein the second set of interconnects include second conductive sections.

11. The method of claim 10, wherein the ILD sections are made of a dielectric material having a Young's modulus equal to or greater than 5 GPa.

12. The method of claim 11, wherein the ILD spacers have a width in a range of about 10 nm to about 30 nm.

13. The method of claim 12, wherein the first set of interconnects include a first barrier section on sidewalls of interlayer dielectric (ILD) sections, a first liner section on the first barrier sections, and a first conductive section on each first barrier section.

14. The method of claim 13, further comprising forming a post metal cap on each of the first conductive sections.

* * * * *